United States Patent
Roohparvar

(10) Patent No.: US 6,587,903 B2
(45) Date of Patent: *Jul. 1, 2003

(54) SOFT PROGRAMMING FOR RECOVERY OF OVERERASURE

(75) Inventor: Frankie Fariborz Roohparvar, Cupertino, CA (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/034,861

(22) Filed: Feb. 27, 1998

(65) Prior Publication Data

US 2001/0010647 A1 Aug. 2, 2001

(51) Int. Cl.$^7$ .................. G11C 7/00; G11C 11/40; G11C 11/34; G11C 16/04; G11C 16/00

(52) U.S. Cl. ............ 710/104; 365/185.29; 365/185.22; 365/185.3; 365/185.11; 365/185.24; 365/185.13; 365/185.28; 365/185.33; 365/185.18; 365/185.19; 365/185.21; 710/103; 710/129

(58) Field of Search ............... 365/185, 185.3, 365/185.11, 185.24, 185.18, 185.28, 185.22, 185.29, 185.33; 395/425; 710/103, 129, 104

(56) References Cited

U.S. PATENT DOCUMENTS

| 5,412,603 A | * | 5/1995 | Schreck et al. ........ 365/189.01 |
| 5,530,675 A | * | 6/1996 | Hu ............... 365/218 |
| 5,535,164 A | | 7/1996 | Adams et al. .............. 365/201 |
| 5,568,426 A | | 10/1996 | Roohparvar et al. ... 365/185.22 |
| 5,576,992 A | * | 11/1996 | Mehrad ................ 365/185.24 |
| 5,600,593 A | | 2/1997 | Fong ..................... 365/185.19 |
| 5,615,159 A | | 3/1997 | Roohparvar ................. 365/201 |
| 5,619,453 A | | 4/1997 | Roohparvar et al. ... 365/185.33 |
| 5,627,784 A | | 5/1997 | Roohparvar ............ 365/189.01 |
| 5,636,166 A | | 6/1997 | Roohparvar ................ 365/194 |
| 5,642,311 A | * | 6/1997 | Cleveland et al. ....... 365/185.3 |
| 5,657,268 A | * | 8/1997 | Truong et al. ......... 365/185.13 |
| 5,677,879 A | | 10/1997 | Roohparvar et al. ... 365/185.22 |
| 5,680,350 A | * | 10/1997 | Lee ....................... 365/185.24 |
| 5,699,298 A | | 12/1997 | Shiau et al. ........... 365/185.18 |
| 5,745,410 A | * | 4/1998 | Yiu et al. ................ 365/185.3 |
| 5,751,944 A | | 5/1998 | Roohparvar et al. ... 395/183.18 |
| 5,764,568 A | * | 6/1998 | Chevallier ............ 365/185.03 |
| 5,774,400 A | * | 6/1998 | Lancaster et al. ........ 365/185.3 |
| 5,781,477 A | * | 7/1998 | Rinerson et al. ....... 365/185.29 |
| 5,790,459 A | | 8/1998 | Roohparvar ........... 365/185.21 |
| 5,801,985 A | | 9/1998 | Roohparvar et al. ... 365/185.01 |
| 5,812,452 A | * | 9/1998 | Hoang ................... 365/185.11 |
| 5,856,944 A | * | 1/1999 | Prickett, Jr. et al. .... 365/185.29 |
| 5,856,946 A | * | 1/1999 | Chan et al. ............ 365/185.19 |
| 5,890,193 A | * | 3/1999 | Chevallier .................. 711/103 |
| 5,901,090 A | * | 5/1999 | Haddad et al. ........ 365/185.29 |
| 5,912,845 A | * | 6/1999 | Chen et al. .............. 365/185.3 |
| 5,930,174 A | * | 7/1999 | Chen et al. ............ 365/185.29 |
| 6,044,015 A | * | 3/2000 | Van Houdt et al. ..... 365/185.15 |
| 6,175,521 B1 | * | 1/2001 | Pascucci et al. ........ 365/185.18 |
| 6,240,023 B1 | | 5/2001 | Roohparvar ............. 365/185.3 |

* cited by examiner

Primary Examiner—Jeffrey Gaffin
Assistant Examiner—Tammara Peyton
(74) Attorney, Agent, or Firm—Schwegman, Lundberg, Woessner & Kluth, P. A.

(57) ABSTRACT

A method of erasing a memory cell includes the step of erasing a memory cell. The current in the memory cell is measured. If the measured memory cell current approximately exceeds a predetermined level, the memory cell is soft programmed so if the memory cell is not overerased, the memory cell is undisturbed. The memory cell is soft programmed until the measured memory cell current is less than or equal to the predetermined level.

23 Claims, 2 Drawing Sheets

US 6,587,903 B2

SOFT PROGRAMMING FOR RECOVERY OF OVERERASURE

FIELD OF THE INVENTION

The present invention relates to operations in flash memory devices. More particularly, the present invention relates to a method and apparatus to diminish undesirable programming in a flash memory device.

BACKGROUND

Flash memory devices have proven to be important memory elements in the past several years, and industry pundits predict an ever-increasing role for such devices in the future. A great advantage flash memory devices have over typical EPROM's and EEPROM's are, respectively, system programmability and lower cost.

Despite the many advantages of flash memories over other memories, flash memory devices have several opportunities for improvement. For example, flash memories in their typical implementations suffer from the problems of "overerased memory cells" and "wild cells" which result in all memory cells not behaving exactly alike with respect to their electrical behavior. In fact, many flash memory devices include wide variations of electrical behavior between adjacent memory cells.

Overerased memory cells are particularly undesirable. Overerased memory cells arise when a block of memory cells is erased. Because of the behavioral dissimilarities of the memory cells within the block, one memory cell typically takes longer to erase than other memory cells. As a result, this memory cell defines the erasure time for all memory cells in the block.

Erasing the block for the defined erasure time results in some memory cells being overerased. Overerased memory cells are memory cells that were erased for an excessive period of time. Overerased memory cells have an undesirable large positive charge on their floating gate. For example, an overerased memory cell will have a floating gate voltage of 3V. A non-overerased memory cell will typically have a floating gate voltage of 0.5V. As a result, overerased memory cells operate in the depletion mode. Hence, overerased memory cells conduct current through a bit line to which they are coupled even when the overerased cells are biased with zero drain voltages.

Thus, selected programmed memory cells, coupled to the same bit line as an overerased memory cell, will appear to draw current and appear to be erased. Therefore, data stored in the flash memory devices may not be accurately read. Therefore, overerased memory cells are preferably corrected.

Typically, overerased memory cells are corrected, by applying a gate voltage of 12 volts to the entire block of memory cells. As the floating gate voltage of such memory cells becomes sufficiently lower to come out of depletion mode. With the gate of the overerased cells sufficiently higher than normally erased cells, the control gate couples the floating gate even higher, through a tunnelling mechanism in the channel or source area. Electrons are pulled to the floating gate, and lower the voltage of the floating gate. However, during the aforementioned process, since the procedure affects all of the cells in the block, some non-overerased memory cells become undesirably programmed. Therefore, there is a need to correct overerased memory cells while avoiding undesired programming of non-overerased memory cells.

SUMMARY OF THE INVENTION

The present invention provides a method of erasing a memory cell, including the step of erasing a memory cell. The current in the memory cell is measured. If the measured memory cell current approximately exceeds a predetermined level, the memory cell is soft programmed so if the memory cell is not overerased, the memory cell is undisturbed. The memory cell is soft programmed until the measured memory cell current is less than or equal to the predetermined level.

In one embodiment, the memory cell is soft programmed for approximately 100 microseconds. In another embodiment, the predetermined level is 10 microamps. In yet another embodiment, the present invention includes the step of applying a gate voltage between approximately 6 and 7 volts, and a drain voltage of approximately 5 volts to a memory cell.

In another embodiment, the present invention provides a state machine, controlling soft programming of a memory cell, that includes a distribution adjustment group. The distribution adjustment group includes a read column state for ascertaining whether overerased cells exist in a column. An increment column state, coupled to the read column state, selects a next column. A soft program row state, coupled to the read column state, corrects an overerased memory cell while not disturbing a non-overased memory cell. An increment row state, coupled to the soft program row and read column states, selects a memory cell in a subsequent row.

In yet a further embodiment, the present invention provides a memory, including a memory cell array including blocks of memory cells, and a command execution logic module. A state machine, coupled to the command execution logic module, controls soft programming of a memory cell in the memory cell array. An X-interface circuit is coupled to the state machine. A Y-interface circuit is coupled to the state machine. The state machine includes a distribution adjustment group that comprises a read column state. An increment column state is coupled to the read column state. A soft program row state, in which a non-overerased memory cell is undisturbed, is coupled to the read column state. An increment row state is coupled to the soft program row and read column states. In another embodiment, as system may be formed by coupling the memory to a memory controller.

DETAILED DESCRIPTION OF THE PREFERRED EMBODIMENTS

Figure 1:
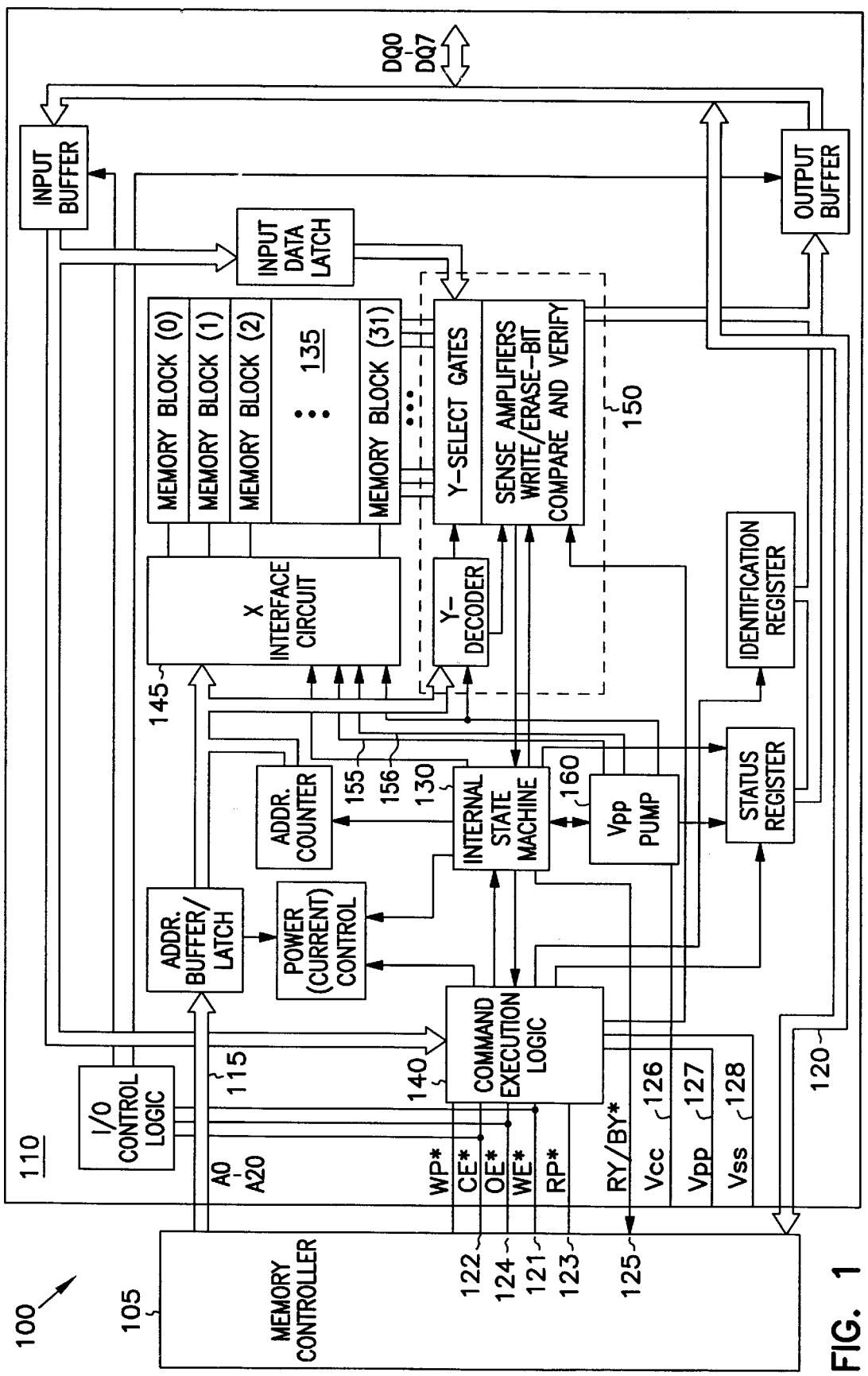
FIG. 1 shows a schematic diagram illustrating generally a memory system embodying features of the present invention.

In the following detailed description, reference is made to the accompanying drawings which form a part hereof, and in which is shown, by way of illustration, specific embodiments in which the invention may be practiced. In the drawings, like numerals describe substantially similar components throughout the several views. The embodiments are described in sufficient detail to enable those skilled in the art to practice the invention. Other embodiments may be used and logical, structural, and electrical changes may be made without departing from the scope of the present invention. The following detailed description is, therefore, not to be taken in a limiting sense, and the scope of the present invention is defined only by the claims and their equivalents.

The present invention provides a method of soft programming overerased cells so that non-overerased cells are not undesirably programmed. In one embodiment, soft programming is accomplished by applying a relatively low gate voltage, of approximately 6 to 7 volts, to memory cells. As a result, non-overerased memory cells are not undesirably programmed, or disturbed, because the relatively lower gate voltage in addition to the relatively low floating gate voltage of the non-overerased cell are insufficient to draw not electrons into the floating gates of the non-overerased memory cells. However, the present invention permits overerased memory cells to be corrected by hot electron injection. This technique can be used in a memory system as described below.

FIG. 1 is a schematic diagram illustrating generally, by way of example, but not by way of limitation, one embodiment of a memory system 100 embodying features of the present invention. Memory system 100 includes memory controller 105 and memory integrated circuit (IC) 110. Controller 105 includes a microprocessor or any other controller providing interface signals to the memory IC 110, as described below. Such interface signals include addressing signals, provided at address lines 115, and data signals, communicated at data lines 120. Other interface signals provided by controller 105 include write enable (WE*) at node 121, chip enable (CE*) at node 122, reset/power-down (RP*) at node 123, and output enable (OE*) at node 124, all of which are active low signals. Memory IC 110 provides a status signal (RY/BY*) at node 125 to controller 105 to indicate the status of internal state machine 130. Memory IC 110 also receives a positive power supply voltage ($V_{CC}$) at node 126 (e.g., approximately 3.3 Volts or approximately 5 Volts), a write/erase supply voltage ($V_{PP}$) at node 127 (e.g., approximately 5 Volts), and a reference voltage such as substrate ground voltage ($V_{SS}$) at node 128 (e.g., approximately 0 Volts).

In the embodiment of FIG. 1, memory IC 110 includes a memory cell array 135 of floating gate transistor memory cells arranged in 32 memory cell blocks. Each memory cell block in memory cell array 135 contains 64 kilobytes of floating gate transistor memory cells. Data stored in each memory cell block is erased independently, as described below, without disturbing data stored in other memory cell blocks. A command execution logic module 140 receives the above-described interface signals from controller 105. The command execution logic module 140 controls an internal state machine 130, which provides write and block erase timing sequences to memory cell array 135 through X-interface circuit 145 and Y-interface circuit 150.

Y-interface circuit 150 provides access to individual memory cells through bit lines in memory cell array 135. Y-interface circuit 150 includes a Y-decoder circuit, Y-select gates, sense-amplifiers, and write/erase bit compare and verify circuits. X-interface circuit 145 provides access to rows of memory cells through wordlines in memory cell array 135, which are electrically coupled to control gates (also called select gates) of floating gate transistors in memory cell array 135. X-interface circuit 145 includes decoding and control circuits for erasing individual blocks of memory cells in memory cell array 135.

Figure 2:
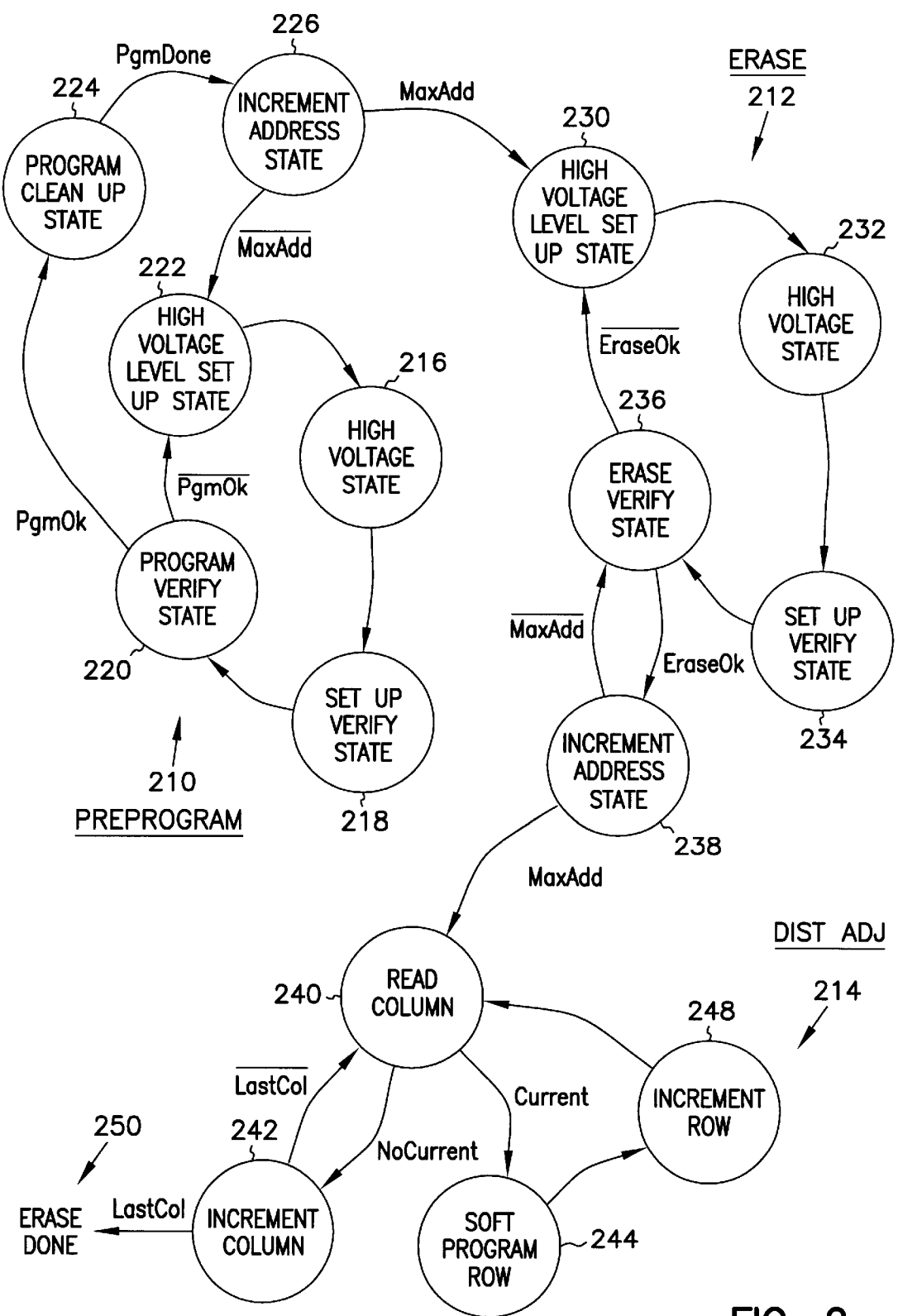
FIG. 2 shows a state diagram of an erase operation for use with a state machine.

FIG. 2 shows a state diagram, of the state machine 130, for controlling an erase operation in a flash memory. Another state machine is described in U.S. Pat. No. 5,619,453, which is hereby incorporated by reference for its description of the state diagram therein. The state diagram includes a plurality of interconnected execution cycles including incremental cycles and other cycles. The execution cycles of the erase operation are arranged in a plurality of interconnected groups, including a pre-program group 210, an erase group 212, and a distribution adjustment group 214 connected together in the order shown. In order to erase a block of flash memory, the state machine 130 executes the cycles in the interconnected groups.

The pre-program group 210 includes a plurality of interconnected execution cycles including incremental cycles and other cycles. As shown in FIG. 2, the pre-program group includes a high voltage state 216 connected to a setup verify state 218. The setup verify state 218 is connected to a program verify state 220. If the program verify state 220 determines that the program is not in order, the operation jumps to a high voltage level setup state 222. The high voltage level setup state 222 is connected back to the high voltage state 216. If the program verify state 220 determines that the operation is indeed in order, the operation jumps to a program cleanup state 224. The above described states are designated as other cycles, as opposed to incremental cycles described below.

The program clean up state 224 jumps to an increment address state 226 when the operation has completed the program for a given address. The increment address state 226 is designated as an incremental cycle because it adjusts a variable, determines if the adjusted variable is a predefined stopping point, and, if so, proceeds with the operation. If not, the incremental cycle sends the operation back into another loop, as appreciated by those skilled in the art. With regard to the increment address state 226, the operation increases the address variable and compares it to a predetermined maximum address. If the variable is at the maximum address, the operation proceeds to the erase group 212 of cycles. If not, the operation jumps back to the high voltage level setup state 222 and repeats the cycles in the preprogram group 210.

The erase group 212 also includes a plurality of cycles including incremental cycles and other cycles. The initial cycle in the erase group 212 is a high voltage level setup state 230 which takes approximately 400 nanoseconds to complete. The high voltage level setup state 230 then jumps to a high voltage state 232 which takes approximately 10 milliseconds to complete.

In one embodiment of the present invention, a block of memory cells is erased during the high voltage state 232. In another embodiment, the block of memory cells is erased by applying a gate voltage of approximately −10 to −11 volts to the memory cells. By Fowler-Nordheim tunneling, electrons are drawn from the floating gates into the sources of the memory cells. In this state, some memory cells become overerased and have a floating gate biased with a net positive voltage. As described above, the net positive voltage causes the overerased memory cells to become normally conductive. Therefore, the present invention provides a method for soft programming a block of memory cells to correct overerasures, as subsequently described.

The next cycle is the setup verify state 234, which takes approximately 5 microseconds to complete. The erase verify state 236 follows the setup verify state 234 and takes approximately 200 nanoseconds to complete. The above described cycles of the erase group 212 are know as other cycles, again as opposed to increment cycles. If the erase verify state 236 determines that the erase operation is complete, the operation jumps to an increment address state 238 which is an increment cycle.

The increment address state 238 of the erase group 212 is designated as an incremental cycle because, like the increment address state 226 of the pre-program group 210, it adjusts a variable, determines if the adjusted variable is a predefined stopping point, and, if so, proceeds with the operation. If not, the incremental cycle sends the operation back into another loop. With regard to the increment address state 238 of the erase group 212, the operation increases the address variable and compares it to a predetermined maximum address. If the variable is at the maximum address, the operation proceeds to distribution adjustment group 214 of cycles. If not, the operation jumps back to the erase verify state 236.

The distribution adjustment group 214 includes a plurality of other cycles. The erase group 212 jumps to the read column state 240 of the distribution adjustment group 214. Upon commencing the read column state 240, the first column is selected. This read operation is performed with no rows selected. If the read column state 240 ascertains that no memory cells in the selected column are overerased then the operation jumps to the increment column state 242 which selects the next column. Subsequently, the operation jumps back to the read column state 240, until the last column is selected. After the last column is selected, the operation proceeds to the erase done group 250.

However, if the read column state 240 ascertains that one or more memory cells in the selected column are overerased, then the operation jumps from the read column state 240 to soft program row state 244.

Upon commencing the soft program row state 244 in this manner, the memory cell in the first row of the selected column is selected. The memory cell in selected row is then soft programmed to correct the memory cell if it is overerased. The operation then jumps to the increment row state 248 which selects the memory cell in a subsequent row. Then, the operation jumps to the read column state 240 to ascertain whether any memory cells in the selected column remain overerased. If no memory cells remain overerased, then the operation jumps to the increment column state 242, and proceeds as described above.

However, if memory cells remain overerased, the operation sequentially jumps to the soft program row state 244 and then the increment row state 248, as described above. As a result, subsequent rows are soft programmed, even repeatedly, until either the read column state 240 ascertains that no overerased cells remain in the column, or until each memory cell is soft programmed a maximum number of times.

One embodiment of soft programming according to the present invention will now be described. First, during the read column state 240, a column of memory cells is read, with all memory cells biased off, by measuring current in a corresponding bit line. Each column includes a bit line to which memory cells are coupled. The memory cells are biased off by applying a gate voltage of zero volts to each memory cell coupled to the bit line. If the current does not exceed approximately a predetermined level, the next column is read during the increment column state 242. The predetermined level is a current level, for example, approximately between 10 and 12 microamps, which would not mask, and hence permits, an accurate reading of a programmed memory cell.

If the bit line current exceeds the predetermined level, then memory cells in the column are soft programmed, in the soft program row state 244 in the manner described below, until the bit line current does not exceed the predetermined level.

A memory cell is soft programmed during the soft program row state 240 by biasing the selected memory cell with a gate voltage of between approximately 6 and 7 volts, and a drain voltage of approximately 5 volts for approximately 100 microseconds. Typically, even the most overerased memory cells are corrected by applying this bias for such a time period. After soft programming the selected memory cell, the bit line current is measured again during the read column state 240. If the current is below the predetermined level, then the next column is analyzed during the read column state 240 after performing the increment column state 240. However, if the bit line current still exceeds the predetermined level, subsequent memory cells in the column are sequentially soft programmed as described above until the measured current is less than the predetermined level. Again, each bit line in a block of flash memory cells is measured during the read column state 240, and if necessary, soft programmed as described above. In one embodiment, each memory cell coupled to a bit line is soft programmed a maximum of one time. In another embodiment, the foregoing technique can be used to soft program a single memory cell.

This method effectively eliminates overerasures. However, numerous non-overerased memory cells may precede the overerased memory cells in a column. Thus, execution of the distribution adjustment group 214 may take a long time, for example, approximately at least two seconds. Such a lengthy process is undesirable in many systems incorporating flash memory devices. Therefore, there is a further need to diminish the performance time of the distribution adjustment group 214.

An alternative embodiment of the present invention provides a faster method of soft programming. The alternative method of soft programming differs from the first method in that each memory cell is soft programmed during the soft program row state 240 for a relatively shorter predetermined period of time, such as equal to or less than approximately 10, 25 or 50 microseconds, which is substantially less time than required to correct an average overerased memory cell. After each memory cell is soft programmed, the column current is measured. If the column current is below the predetermined level, then the next column is analyzed. However, if the current still exceeds the predetermined level, the subsequent memory cell in the column is soft programmed as described above. If the last memory cell in the column is soft programmed, and the measured current still exceeds the predetermined level, then the foregoing process is repeated such that the first and subsequent memory cells in the column are soft programmed until the measured current is less than the predetermined level, or until each memory cell in the column has been soft programmed a maximum number, for example 10 or 32, of times. If the memory cells in a column have been soft programmed a maximum number of times, and the corresponding measured bit line current still exceeds the predetermined level, then a status register in the memory 110 is set and the memory fails soft programming.

The alternative embodiment of the method of soft programming has the benefit that the overerased cells are soft programmed for a diminished period of time. Thus, the speed of operation of the flash memory is enhanced. Furthermore, the disturbance of non-overerased cells is also diminished.

It is to be understood that the above description is intended to be illustrative, and not restrictive. Many other embodiments will be apparent to those of skill in the art upon reviewing the above description. The invention should, therefore, be determined with reference to the appended claims, along with the full scope to which such claims are entitled.

What is claimed is:

1. A method of erasing a plurality of memory cells comprising:
   erasing a plurality of memory cells;
   measuring a first leakage current in a column containing the memory cells;
   if the measured leakage current exceeds a predetermined level, soft programming each of the memory cells by applying appropriate voltages to a gate and a drain of each memory cell for a time period of less than 100 microseconds, and wherein soft programming further comprises applying a gate voltage of between approximately 6 and 7 volts, and a drain voltage of approximately 5 volts to each memory cell; and
   measuring a second leakage current in the column after soft programming each memory cell in the column to determine if the second leakage current is below the predetermined level.

2. The method of claim 1, wherein the predetermined level comprises 10 microamps.

3. A method of erasing a plurality of memory cells comprising:
   erasing a plurality of memory cells in a column;
   measuring a first current in the column;
   if the first current exceeds a predetermined level, sequentially soft programming each of the memory cells in the column by applying appropriate voltages to a gate and a drain of each memory cell for a time period of less than 50 microseconds;
   measuring a second current in the column after all of the memory cells in the column are soft programmed to determine if the second current is below the predetermined level; and
   wherein soft programming comprises applying a gate voltage of between approximately 6 and 7 volts, and a drain voltage of approximately 5 volts to a memory cell.

4. The method of claim 3, wherein the time period comprises approximately 25 microseconds.

5. The method of claim 3, wherein the predetermined level comprises 10 microamps.

6. The method of claim 3, wherein the time period comprises approximately 10 microseconds.

7. A flash memory device comprising:
   an array of floating gate memory cells arranged in a plurality of rows and columns; and
   control circuitry to correct over-erased memory cells, the control circuitry having elements to measure a first current of an array column, to soft program each memory cell in the array column by applying a gate voltage that is between approximately 6 and 7 volts, and a drain voltage of approximately 5 volts to the memory cells for a time period of less than 100 microseconds, and to measure a second current of the array column after soft programming each memory cell in the column to determine if the second current is below a predetermined level.

8. A flash memory device comprising:
   an array of floating gate memory cells arranged in a plurality of rows and columns; and
   control circuitry to correct over-erased memory cells, the control circuitry having elements to measure a first current of an array column, to soft program each memory cell in the array column by applying a gate voltage of between approximately 6 and 7 volts, and a drain voltage of approximately 5 volts to the memory cells for a time period of less than 50 microseconds, and to measure a second current of the array column after all of the memory cells in the column have been soft programed to determine if the second current is below a predetermined level.

9. A flash memory device comprising:
   an array of floating gate memory cells arranged in a plurality of rows and columns; and
   control circuitry to correct over-erased memory cells, the control circuitry having elements to measure a first current of an array column, to soft program each memory cell in the array column by applying a gate voltage of between approximately 6 and 7 volts, and a drain voltage of approximately 5 volts to the memory cells for a time period of less than 25 microseconds, and to measure a second current of the array column after all of the memory cells in the column have been soft programed to determine if the second current is below a predetermined level.

10. A flash memory device comprising:
    an array of floating gate memory cells arranged in a plurality of rows and columns; and
    control circuitry to correct over-erased memory cells, the control circuitry having elements to measure a first current of an array column, to soft program each memory cell in the array column by applying a gate voltage of between approximately 6 and 7 volts, and a drain voltage of approximately 5 volts to the memory cells for a time period of less than 10 microseconds, and to measure a second current of the array column after all of the memory cells in the column have been soft programed to determine if the second current is below a predetermined level.

11. A method of erasing a memory cell, comprising:
    erasing a memory cell;
    measuring a first current in the memory cell;
    if the first current exceeds a predetermined level, soft programming the memory cell by applying appropriate voltages to a gate and a drain of the memory cell for a time period of less than 50 microseconds, wherein soft programming comprises applying a soft program gate voltage that is approximately one-half of a program gate voltage applied during a program operation, and a drain voltage of approximately 5 volts to a memory cell; and
    measuring a second current in the memory cell to determine if the second current is below the predetermined level.

12. The method of claim 11 wherein the program gate voltage comprises approximately 12 volts.

13. A method of operating a floating gate transistor memory cell comprising:
    applying a programming voltage to a control gate of a floating gate transistor memory cell and a drain voltage to a drain of the memory cell to program the memory cell;
    applying an erase voltage to the memory cell to erase the memory cell; and
    applying a soft programming voltage to the control gate that is between the programming voltage and the drain voltage to correct the memory cell if the memory cell is overerased.

14. A method of operating a floating gate transistor memory cell comprising:
- applying a programming voltage to a control gate of a floating gate transistor memory cell and a drain voltage to a drain of the memory cell to program the memory cell;
- applying an erase voltage to the memory cell to erase the memory cell; and
- applying a soft programming voltage to the control gate that is between the programming voltage and the drain voltage to correct the memory cell if the memory cell is overerased; and
- wherein:
  - applying a programming voltage further comprises applying approximately 12 volts to the control gate and approximately 6 volts to the drain to program the memory cell;
  - applying an erase voltage comprises applying approximately −10 to −11 volts to the control gate to erase the memory cell; and
  - applying a soft programming voltage comprises applying between approximately 6 and 7 volts to the control gate and approximately 5 volts to the drain for approximately 100 microseconds to correct the memory cell if the memory cell is overerased.

15. A method of operating a floating gate transistor memory cell comprising:
- applying a programming voltage to a control gate of a floating gate transistor memory cell and a drain voltage to a drain of the memory cell to program the memory cell;
- applying an erase voltage to the memory cell to erase the memory cell; and
- applying a soft programming voltage to the control gate that is between the programming voltage and the drain voltage to correct the memory cell if the memory cell is overerased; and
- wherein applying a soft programming voltage further comprises applying between approximately 6 and 7 volts to the control gate and approximately 5 volts to the drain for equal to or less than approximately 10, 25, or 50 microseconds to correct the memory cell if the memory cell is overerased.

16. A method of operating a floating gate transistor memory cell comprising:
- applying a programming voltage to a control gate of a floating gate transistor memory cell and a drain voltage to a drain of the memory cell to program the memory cell;
- applying an erase voltage to the memory cell to erase the memory cell;
- ascertaining whether the memory cell is overerased; and
- applying a soft programming voltage to the control gate that is between the programming voltage and the drain voltage to correct the memory cell if the memory cell is overerased.

17. A method of operating a floating gate transistor memory cell comprising:
- applying a programming voltage to a control gate of a floating gate transistor memory cell and a drain voltage to a drain of the memory cell to program the memory cell;
- applying an erase voltage to the memory cell to erase the memory cell;
- ascertaining whether the memory cell is overerased; and
- applying a soft programming voltage to the control gate that is between the programming voltage and the drain voltage to correct the memory cell if the memory cell is overerased; and
- wherein:
  - applying a programming voltage further comprises applying approximately 12 volts to the control gate and approximately 6 volts to the drain to program the memory cell;
  - applying an erase voltage comprises applying approximately −10 to −11 volts to the control gate to erase the memory cell;
  - ascertaining whether the memory cell is overerased comprises:
    - applying approximately 0 volts to the control gate;
    - measuring current in a bit line coupled to the memory cell; and
    - ascertaining that the memory cell is overerased if the current exceeds approximately between 10 and 12 microamps; and
  - applying a soft programming voltage comprises applying between approximately 6 and 7 volts to the control gate and approximately 5 volts to the drain for approximately 100 microseconds to correct the memory cell if the memory cell is overerased.

18. A method of operating a floating gate transistor memory cell comprising:
- applying a programming voltage to a control gate of a floating gate transistor memory cell and a drain voltage to a drain of the memory cell to program the memory cell;
- applying an erase voltage to the memory cell to erase the memory cell;
- ascertaining whether the memory cell is overerased; and
- applying a soft programming voltage to the control gate that is between the programming voltage and the drain voltage to correct the memory cell if the memory cell is overerased; and
- wherein applying a soft programming voltage comprises applying between approximately 6 and 7 volts to the control gate and approximately 5 volts to the drain for equal to or less than approximately 10, 25, or 50 microseconds to correct the memory cell if the memory cell is overerased.

19. A flash memory device comprising:
- an array of floating gate transistor memory cells;
- a control circuit to erase the memory cells;
- means for correcting memory cells in the array that are overerased; and
- wherein means for correcting includes means for applying a soft programming voltage comprises applying between approximately 6 and 7 volts to the control gate and approximately 5 volts to the drain for approximately 100 microseconds.

20. The device of claim 19, wherein means for correcting includes means for applying a soft programming voltage to the control gate that is between a control gate programming voltage and a drain programming voltage to correct the memory cell if the memory cell is overerased.

21. The device of claim 19, wherein means for correcting includes means for applying approximately 12 volts to the control gate and approximately 6 volts to the drain to program the memory cell.

22. A flash memory device comprising:

an array of floating gate transistor memory cells;

a control circuit to erase the memory cells;

means for correcting memory cells in the array that are overerased; and, wherein means for correcting includes means for applying between approximately 6 and 7 volts to the control gate and approximately 5 volts to the drain for equal to or less than approximately 10, 25, or 50 microseconds to correct the memory cell if the memory cell is overerased.

23. A method of operating a floating gate transistor memory cell, comprising:

programing a floating gate transistor memory cell, wherein programming includes applying a control gate programming voltage to a control gate of the floating gate transistor memory cell and applying a drain voltage to a drain of the floating gate transistor memory cell;

applying an erase voltage to the memory cell to erase the memory cell; and soft programming the floating gate transistor memory cell, wherein soft programming includes applying a soft programming voltage that is between the control gate programming voltage and the drain voltage to the control gate if the memory cell is overerased.

* * * * *